United States Patent
Manna et al.

(10) Patent No.: US 6,724,214 B2
(45) Date of Patent: Apr. 20, 2004

(54) TEST STRUCTURES FOR ON-CHIP REAL-TIME RELIABILITY TESTING

(75) Inventors: Indrajit Manna, Singapore (SG); Lo Keng Foo, Singapore (SG); Guo Qiang, Singapore (SG); Zeng Xu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/243,392

(22) Filed: Sep. 13, 2002

(65) Prior Publication Data

US 2004/0051553 A1 Mar. 18, 2004

(51) Int. Cl.[7] .............................................. G01R 31/26
(52) U.S. Cl. ..................................... 324/766; 324/158.1
(58) Field of Search ............................... 324/766, 763, 324/158.1, 765, 719, 716, 760

(56) References Cited

U.S. PATENT DOCUMENTS

| | | | |
|---|---|---|---|
| 5,587,665 A | 12/1996 | Jiang | 326/16 |
| 5,625,288 A * | 4/1997 | Snyder et al. | 324/158.1 |
| 6,136,619 A | 10/2000 | Ceuninck et al. | 438/18 |
| 6,169,694 B1 | 1/2001 | Nam et al. | 365/201 |
| 6,535,014 B2 * | 3/2003 | Chetlur et al. | 324/765 |

* cited by examiner

Primary Examiner—Kamand Cuneo
Assistant Examiner—Tung X. Nguyen
(74) Attorney, Agent, or Firm—George O. Saile; Rosemary L. S. Pike (57) ABSTRACT

A first on-chip test structure monitors hot carrier degradation. A degrading ring oscillator is subjected to hot carrier effects while a non-degrading ring oscillator is not. As the device ages, hot carrier effects degrade the degrading ring counter. The second test structure monitors TDDB degradation. A plurality of N parallel connected capacitors have a stress voltage applied to them such that the time to failure of the first capacitor is the same that experienced by percentage of gates under normal usage. A drop in the resistance indicates breakdown of a capacitor. The third test structure monitors electromigration degradation. M minimum width metal lines are connected in parallel. A current is applied such that the time to failure of all metal lines is the same as that experienced by a percentage of minimum width metal lines under normal usage. An increase in resistance indicates breakdown of a metal line.

27 Claims, 5 Drawing Sheets

TEST STRUCTURES FOR ON-CHIP REAL-TIME RELIABILITY TESTING

BACKGROUND OF THE INVENTION (1) Field of the Invention

The invention generally relates to a method and apparatus used in semiconductor manufacturing and, more particularly, to a method and device for determining the reliability and predicting the end-of-life of semiconductor devices in the fabrication of integrated circuits.

(2) Description of Prior Art

Currently, various specialized test structures are used to monitor reliability wear-out mechanisms in integrated circuits. These mechanisms include gate-oxide breakdown, electromigration, stress migration, hot carrier injection degradation, etc. Data extrapolation is performed using conditions based upon reliability and failure distribution models. Reliability simulators such as BTABERT® are used to calculate circuit "age" or equivalent estimates of the degree of wear-out of circuits based upon device voltage and current calculations and operating duty cycle. These data are used to predict the expected life of the circuit.

The previously mentioned hot carrier injection is one of the major reliability wear-out mechanisms in VLSI circuits. Presently, hot carrier robustness of a CMOS process is evaluated by stressing individual devices at elevated voltages and extrapolating lifetime to the standard operating voltage ($V_{dd}$). As device geometries shrink, the electric field generating hot carriers is increasing dramatically. The time a device is stressed in standard operation is quite small and accordingly, the lifetime estimates using current extrapolating methods become less and less effective. Simulation efforts to model hot carrier injection in large VLSI devices can be time consuming and inaccurate. Additionally, as design cycles shorten, little time is afforded to perform these complex simulations. The iterative nature of degraded circuit simulations make these design cycles even longer and modeling hot carrier effects at all process corners and for all process variations can be quite challenging.

Therefore, there is a need for test structures that can be incorporated into any device that will degrade along with that device and flag an "end-of-life" signal when degradation reaches a prescribed limit. This set of test structures, called the "on-chip reliability monitor", can alleviate the need for reliability modeling. They will occupy a small area and can be included as a substitute die in the prime die area, fit into scribe lines, or placed as part of the product die. Designers need only simulate each product and test structure design for functionality and may avoid the time consuming and cumbersome task of reliability simulation. Where included in the product, the on-chip reliability monitor may be used to predict an end-of-life for a device and flag the need to replace the device.

Other approaches for determining reliability factors exist. U.S. Pat. No. 5,587,665 to Jiang teaches a method where propagation delay and rise and fall times of a series of cascaded inverters are measured under conditions with and without hot carrier induced stress. U.S. Pat. No. 6,169,694 B1 to Nam et al. teaches a method and circuit for performing on-chip wafer level burn-in of DRAM devices. Specifically tested using this method are the oxide film and capacitor failure. U.S. Pat. No. 6,136,619 to Ceuninck et al. describes a circuit and method for determining electromigration induced resistance changes in conductors. A single current source is applied to both a reference and a test conductor structure placed in close proximity on the semiconductor die. The direction of current in the reference conductor structure is alternated using an h-bridge while the current in the test conductor structure flows in only one direction. By alternating the current in the reference conductor structure, the effects of electromigration are eliminated while maintaining identical current magnitudes and conditions in both structures. U.S. Pat. No. 5,625,288 to Snyder et al. describes a method and circuit for determining high frequency reliability and failure modes in test structures. These methods incorporate DC input signals to control various test functions including temperature and operating frequency.

SUMMARY OF THE INVENTION

A principal object of the present invention is to provide a method for monitoring reliability mechanisms including hot carrier effects, gate oxide time-dependent dielectric degradation (TDDB), and electromigration.

Another object of the present invention is to provide a circuit for monitoring reliability mechanisms due to hot carrier effects.

Another object of the present invention is to provide a circuit for monitoring reliability mechanisms due to gate oxide time-dependent dielectric degradation (TDDB).

Another object of the present invention is to provide a circuit for monitoring reliability mechanisms due to electromigration.

Another object of the present invention is to provide a circuit for flagging end of lifetime when one of the reliability mechanisms being monitored exceeds a predetermined threshold prior to failure of the active device, thereby reducing the downtime of the system where the device is utilized.

These objects are achieved using a system with three on chip monitoring test structures. If any of the three test structures indicates an end of life failure, a bit will be set indicating that the IC is near failure and should be replaced. This is done prior to actual device failure and will eliminate down time of the system where this IC is used.

The first test structure monitors hot carrier degradation. The circuit is comprised of two ring oscillators; one with its transistors subjected to hot carrier effects (degrading ring oscillator) and one not subjected to hot carrier effects (non-degrading ring oscillator). Initially, both ring oscillators will each have fixed frequencies. The two frequencies need not be identical. The degrading ring oscillator is applied to the input to a binary counter. The non-degrading ring oscillator frequency is divided down to a lower frequency. This divided frequency gates the binary counter on in one state and resets the counter in the other state. Just after manufacturing, the binary counter will see a finite number of counts "i" during each gating cycle. As the degrading ring oscillator frequency drops due to hot carrier effects, the binary counter will at some point see fewer pulses applied and the resulting count will be "j" (where j<i). The designer will determine the difference (i−j) where degradation indicates a reliability issue and the circuit will then generate an end of life signal if (i−j) exceeds a certain predetermined limit.

The second test structure monitors gate oxide TDDB degradation. A plurality of "N" parallel connected capacitors have a stress voltage applied to them such that the time to failure is some fraction of the time to failure experienced under normal use. Breakdown of a capacitor is observed by a change of resistance of the structure and is used to trigger a bit indicating a TDDB end of life signal.

The third test structure monitors electromigration degradation. "M" minimum width metal lines are connected in parallel. A current is applied to them such that the time to failure is some fraction of the time to failure experienced under normal use. Breakdown of a metal line is observed by a change of resistance of the structure and is used to trigger a bit indicating an electromigration end of life signal.

BRIEF DESCRIPTION OF THE DRAWINGS

In the accompanying drawings forming a material part of this description, there is shown.

DESCRIPTION OF THE PREFERRED EMBODIMENTS

Figure 1:
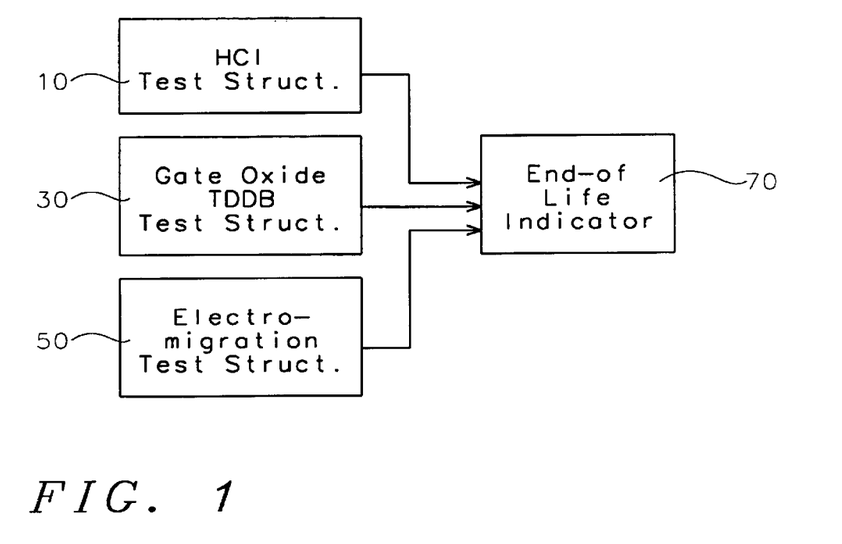
FIG. 1 depicting in block diagram form the reliability system.

Referring now to FIG. 1, a block diagram of the present invention is shown. One embodiment of the present invention uses a system with three on-chip or on-wafer monitoring test structures. A hot carrier injection (HCI) test structure 10 is provided. A gate oxide time-dependent dielectric degradation (TDDB) test structure 30 is provided. Finally, an electromigration test structure 50 is provided. Each of the test structures (10, 30 & 50) has a logic output level indicating when the test structure has determined that the IC has reached the end of its useful life. If any of the test structures outputs that end of life logic level the end-of-life indicator 70 will output a logic level indicating that the IC is near failure and should be replaced.

Figure 2:
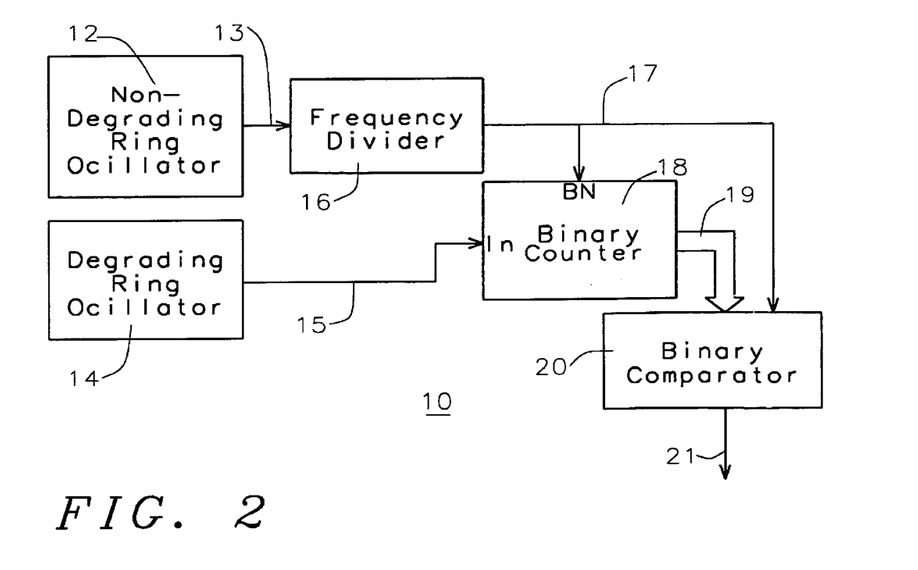
FIG. 2 depicting in block diagram form the system for determining when hot carrier injection failure has occurred.

The HCI test structure 10 monitors hot carrier degradation and will now be further described. Refer now more particularly to FIG. 2, showing a block diagram of an embodiment of the HCI test structure 10 of the present invention. A non-degrading ring oscillator 12 (not subjected to hot carrier effects) and a degrading ring oscillator 14 (that is subjected to hot carrier effects) are provided. The non-degrading output signal 13 from the non-degrading ring oscillator 12 is applied to a frequency divider 16. The frequency divider 16 provides the enable signal 17 for a binary counter 18 and a binary comparator 20. The frequency of the enable signal 17 is a fraction of the frequency of the non-degrading output signal 13 given by the formula:

$$f_{En} = \frac{f_{Non-Degraded}}{2^k} \text{ where } (k = 1, 2, 3 \ldots).$$

The degrading output signal 15 from the degrading ring oscillator 14 is applied to the input of the binary counter 18. The multiple bit output 19 from the binary counter 18 is applied to the input of the binary comparator 20. The HCI end of life indicator 21 is provided from the output of the binary comparator 20.

Figure 3:
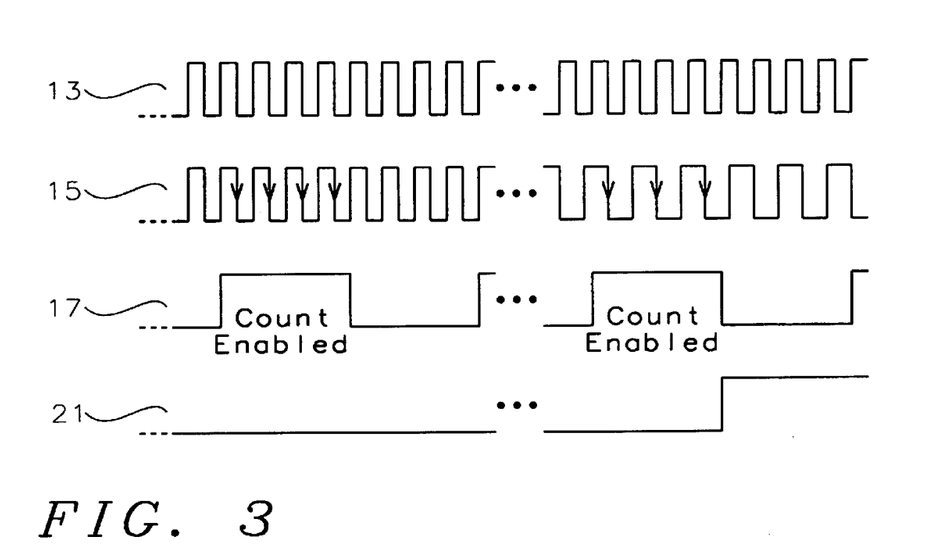
FIG. 3 showing a timing example of the system of FIG. 1.

Refer now to FIG. 3 showing the timing of the HCI test structure 10 of FIG. 2. It should be noted that FIG. 3 is only an example of the circuit operation and the actual timing may be varied as needed. The non-degrading output signal 13 is shown. The degrading output signal 15 is shown prior to degradation on the left and after degradation on the right. It should be noted that the frequency of the non-degrading output signal 13 and degrading output signal 15 need not be the same prior to degradation, but are shown the same in this example of operation. In this example, the enable signal 17 (from the frequency divider 16) is one-eighth of the frequency of the non-degrading output signal 13. During its high period, the enable signal 17 provides the enable to the binary counter 18. During its low period, the enable signal 17 resets the binary counter 18 and initiates the functioning of the binary comparator 20. If responding to falling input edges when the binary counter 18 is enabled, the multiple bit output 19 will be "four" ($0100_2$) prior to degradation (left side) of the degrading output signal 15, but the multiple bit output 19 will only be "three" ($0010_2$) after degradation (right side). During the low period of the enable signal 17 the comparator compares the multiple bit output 19 against a fixed number (four in this example) and will signal an end of life indicator 21 when the multiple bit output 19 is less than four by a predetermined limit.

Thus, when the device is new, the binary counter 18 will be enabled for a finite number of degrading ring oscillator 14 pulses "i" during each gating cycle. As the degrading ring oscillator 14 frequency drops due to hot carrier effects, the binary counter 18 will at some point see fewer pulses applied and the resulting output count will be "j" (where j<i). The binary comparator 20 will be designed such that when the difference (i−j) indicates a reliability issue, the circuit will then generate an end of life flag.

Figure 4A:
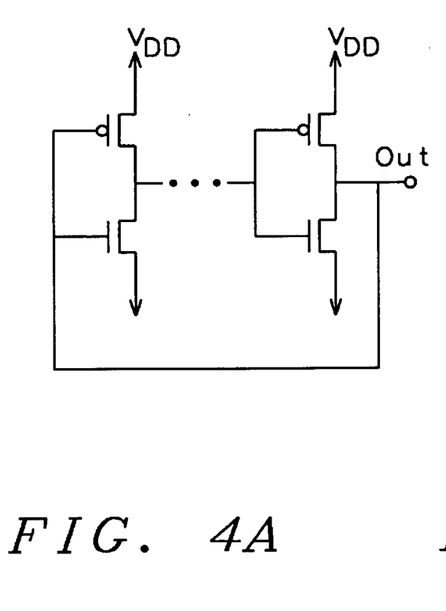
FIG. 4a schematically showing one embodiment of the degrading ring oscillator of FIG. 1.
Figure 4B:
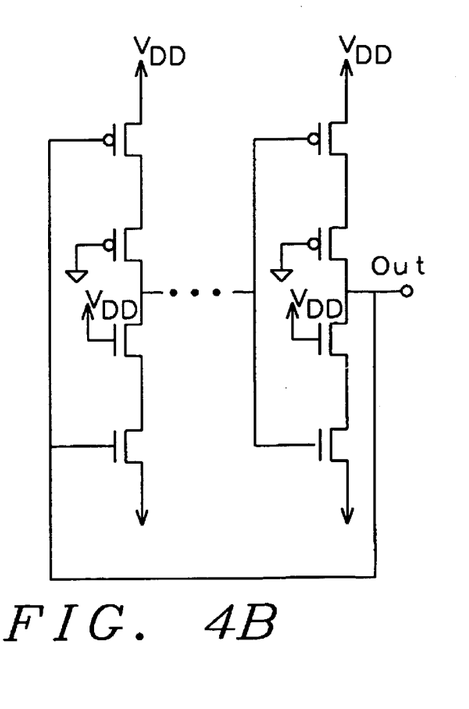
FIGS. 4b and 4c each schematically showing an embodiment the non-degaing ring oscillator of FIG. 1.
Figure 4C:
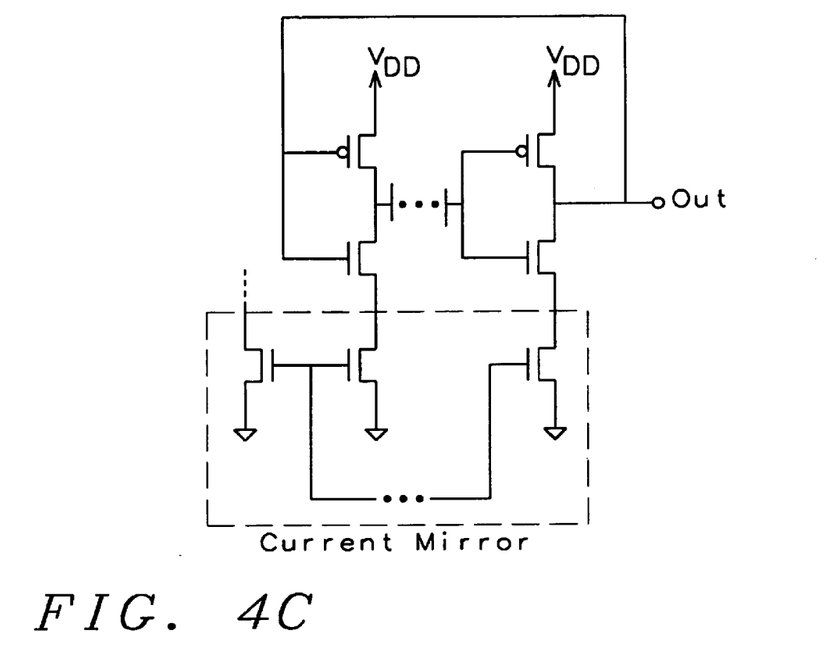

The degrading ring oscillator 14 can be fabricated, for example, using multiple pairs of inverters as depicted in FIG. 4a. To reduce the voltage across the devices, the non-degrading ring oscillator may, for example, be fabricated similar to FIG. 4a using FETs with longer channel lengths. Stacked FETs may be used, for example, as shown in the non-degrading ring oscillator of FIG. 4b. FIG. 4c shows another example of an embodiment of the non-degrading ring oscillator using a current mirror to reduce the potential across each of the FETs.

Figure 5:
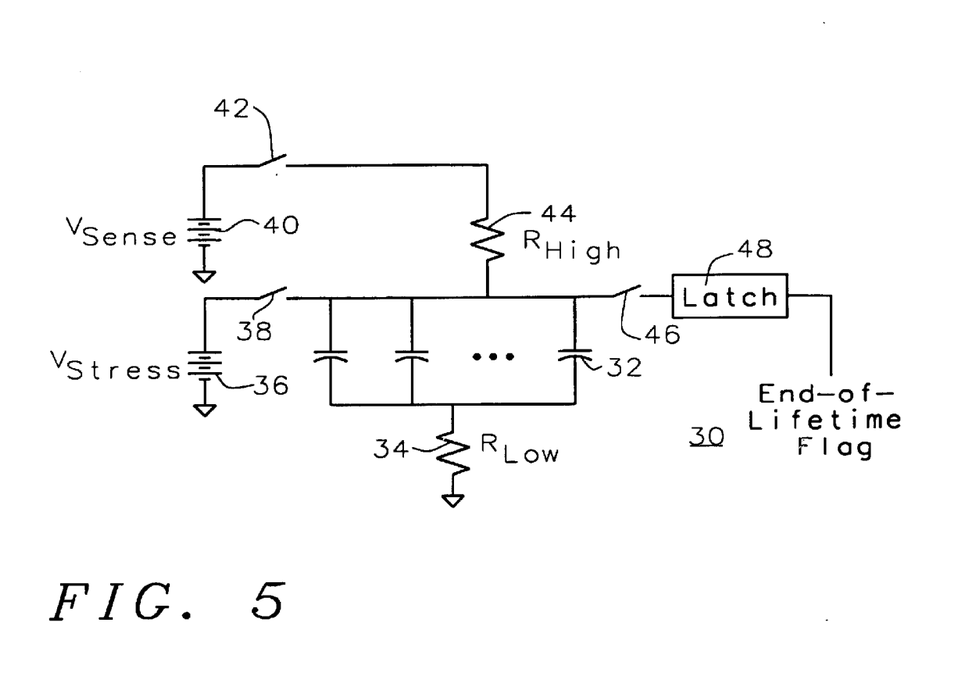
FIG. 5 showing one embodiment of the TDDB end of life test circuit.

The second test structure 30 monitors gate oxide TDDB degradation. Refer to FIG. 5 showing one embodiment of a circuit for determining the TDDB end of life. A plurality of N parallel-connected capacitors 32 is provided. This plurality of capacitors 32 is placed in series with a low resistance 34 connected to a circuit common. A stress voltage 36 is applied through a switch 38 to the plurality of capacitors 32 and low resistor 34 series combination. The capacitor stress voltage 36 is a fixed voltage set to between about 1.2 and 1.8 times the IC supply voltage (Vdd) depending upon the fabrication technology used. To sense a capacitor failure, a sense voltage 40, equal to Vdd, is applied through a switch 42 to one end of a high resistance 44; the other end of this high resistance 44 is tied to the plurality of capacitors 32 and low resistance 34 series combination. The plurality of capacitors 32 is connected through a switch 46 to a latch 48.

The plurality of capacitors 32 is stressed by closing switch 38 while switches 42 and 46 are open, thereby applying the stress voltage 36. To sense the plurality of capacitors 32 failure, switch 38 is opened while switches 42 and 46 are closed. This removes the stress voltage 36 and applies the sense voltage 40 to the plurality of capacitors 32 through high resistance 44. If the capacitors 32 are functioning properly (high resistance) the voltage at the input to the latch 48 will be a logic "1" (high) and the output of the latch 48 (end-of-lifetime flag) will be "0" (low). Breakdown of a capacitor 32 is observed by a drop in the resice of the plurality during sensing, thereby pulling the input to the latch 48 to a logic "0" (low) and the output of the latch 48 (end-of-lifetime flag) will be "1" (high).

Figure 6:
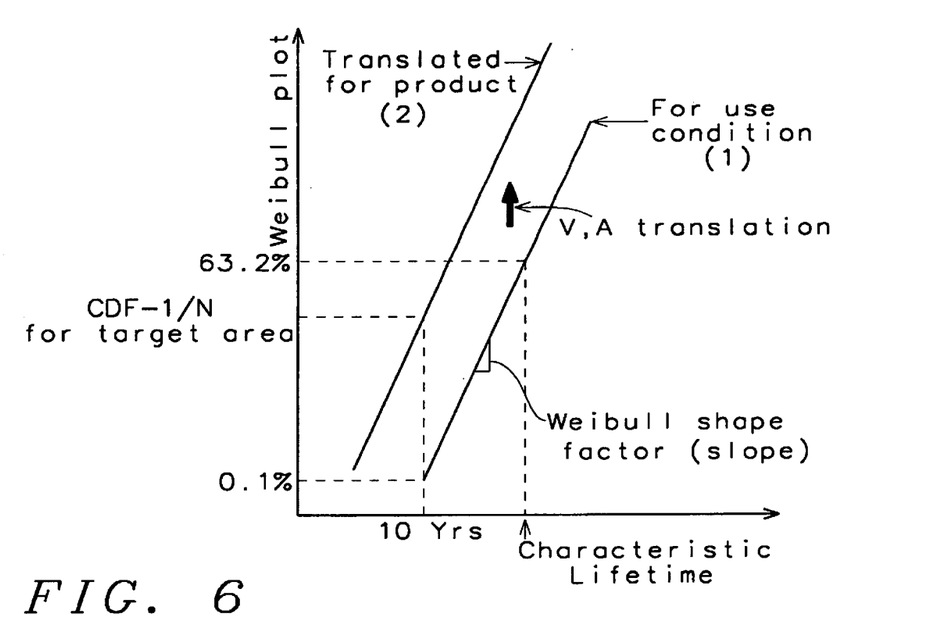
FIG. 6 showing a Weibull plot used to determine the parameters in the TDDB reliability mechanism.

FIG. 6 shows the translation of the Weibull plot with voltage and area used to design the capacitor test plurality structures for the TDDB end-of-lifetime indicator. The cumulative distribution function (CDF) is chosen to be 1/N where N is the number of capacitors 32 in the plurality. In order to design a proper on-chip TDDB monitoring circuit for a particular product and process, target oxide area must be known and Weibull distribution parameters (characteristic lifetime and shape parameters shown in FIG. 6) must be characterized. By translating the Weibull plot (1) by stress voltage and oxide area of the product, Weibull plot (2) results for a particular product. The stress voltage and number (N) of capacitors 32 are chosen so that 1/N percentile of the CDF is approximately 10 years for Weibull plot (2). FIG. 6 uses an example of 0.1%, but the percentile may be changed by the designer depending upon the definition of device lifetime.

Figure 7:
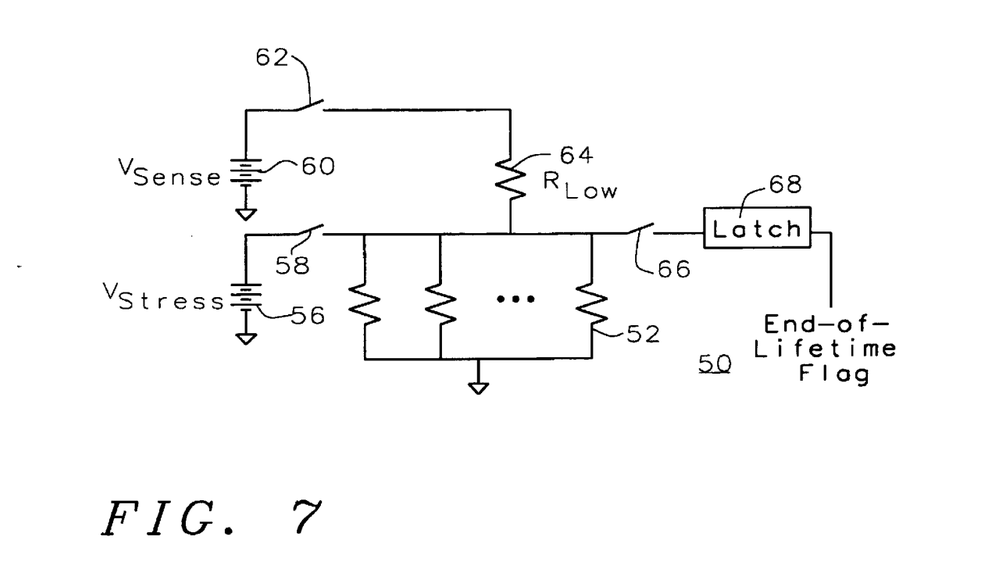
FIG. 7 showing one embodiment of the electromigration end of life test circuit.

The third test structure 50 monitors electromigration degradation. Referring now more particularly to FIG. 7, "M" parallel connected, minimum width, metal lines 52 are provided with one end of the metal lines connected to a circuit common. A fixed stress voltage 56 of between about 0.5 and 1.0 times Vdd is applied through switch 58 to the other end of the metal lines 52. The stress voltage is determined based upon metal line 52 resistance and fabrication technology. To sense a metal line 52 failure, a sense voltage 60 (typically 0.5 times Vdd) is applied through a switch 62 to one end of a low resistance 64; the other end of this low resistance 64 is tied to the metal lines 52. The metal lines 52 are connected through a switch 66 to the set input of a latch 68.

The metal lines 52 are stressed by closing switch 58 while switches 62 and 66 are open, thereby applying the stress voltage 56. To sense a metal line 52 failure, switch 58 is opened while switches 62 and 66 are closed. This applies the sense voltage 60 to the plurality of metal lines 52 through low resistance 64. If the metal lines 52 are functioning properly (having a low resistance) the voltage at the input to the latch 68 will be logic "0" (low) and the output of the latch 68 (end-of-lifetime flag) will be "0" (low). Failure (opening) of a single metal line 52 during stressing increases the current in the remaining lines 52 causing them to systematically open. Failure of all metal lines 52 is observed by a large increase in the resistance of the parallel metal lines 52 during sensing, thereby pulling the set input of the latch 68 to a logic "1" (high) thereby setting the latch 68 and making the end-of-lifetime flag a "1" (high).

Figure 8:
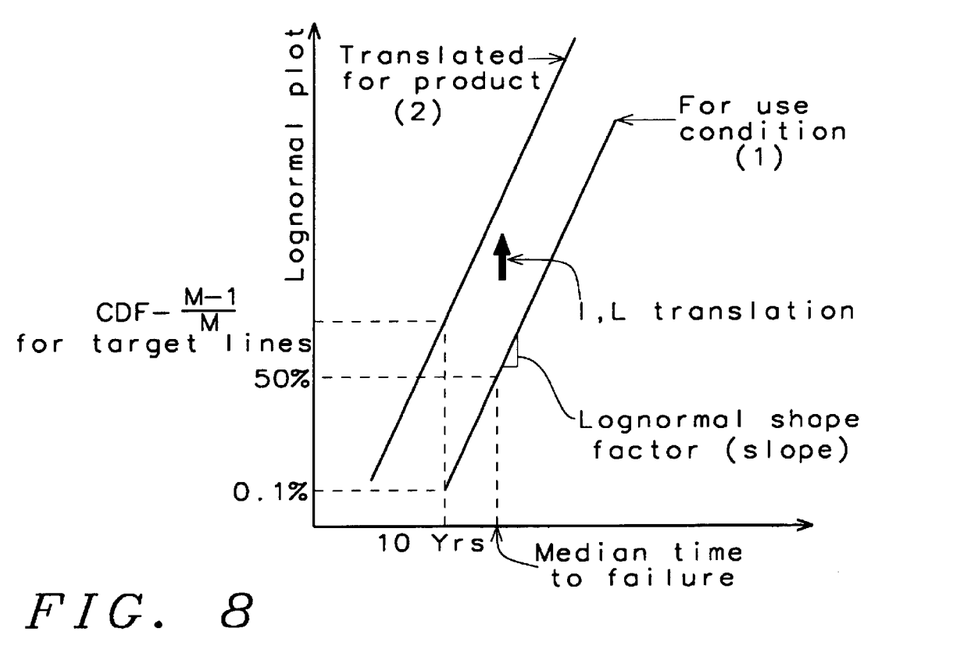
FIG. 8 showing a lognormal plot used to determine the parameters in the electromigration reliability mechanism.

FIG. 8 shows the translation of a lognormal plot with stress current and area used to design the metal line structures for the electromigration end-of-lifetime indicator. In designing an on-chip electromigration monitoring circuit for a particular process and product, statistical strategies similar to the TDDB design are employed. Lognormal distribution parameters (median time to failure and shape parameter) must be characterized. By translating lognormal plot (1) by stress current the second lognormal plot (2) results for a particular fabrication technology. Stress current (determined by the stress voltage 56) and the number (M) of metal lines 52 are chosen so that (M−1)/M percentile of the translated CDF is approximately ten years for lognormal plot (2). FIG. 8 uses an example of 0.1%, but the percentile is chosen by the designer depending upon the definition of device lifetime.

The present invention discloses a method and circuit for an on-chip end-of-life indicator. The method determines when a device reaches the end of useful life with regard to hot carrier injection, gate oxide failure and electromigration and indicates that the device needs replacing. This is done prior to actual device failure and will eliminate down time of the system where this IC is used. A failure is indicated whenever one or more of the three mechanisms indicates end-of-life for that mechanism.

While the invention has been particularly shown and described with reference to the preferred embodiments thereof, it will be understood by those skilled in the art that various changes in form and details may be made without departing from the spirit and scope of the invention.

What is claimed is:

1. A method for indicating end-of-lifetime in an integrated circuit comprising:

predicting hot carrier injection failure wherein said predicting hot carrier injection failure is accomplished by measuring the frequency of a ring oscillator being degraded by hot carrier injection wherein said frequency of said ring oscillator is measured by counting pulses from said ring oscillator over a fixed interval and indicating failure when said frequency drops below a given threshold;

predicting gate oxide TDDB failure wherein said predicting gate oxide TDDB failure is accomplished by measuring the resistance of a plurality of capacitors being exercised by a stress voltage, wherein said resistance of said plurality of capacitors is determined by application of a sense voltage in series with a large resistor to said plurality of capacitors and measuring the voltage across said plurality of capacitors, and by indicating failure when said resistance of said plurality of capacitors drops below a given threshold;

predicting electromigration failure wherein said predicting electromigration failure is accomplished by measuring the resistance of a plurality of parallel connected, minimum width, metal lines being exercised by a stress voltage wherein said resistance of said plurality of parallel connected, minimum width, metal lines is determined by application of a sense voltage in series with a small resistor to said plurality of parallel connected, minimum width, metal lines and measuring the voltage across said plurality of parallel connected, minimum width, metal lines and by indicating failure when said resistance of said plurality of parallel connected, minimum width, metal lines rises above a given threshold; and indicating when either of said hot carrier injection failure, said gate oxide TDDB failure, or said electromigration failure occurs.

2. The method according to claim 1 wherein said fixed interval is determined by a non-degrading ring oscillator.

3. The method according to claim 1 wherein said fixed interval is determined by a non-degrading ring oscillator and by dividing the frequency of said non-degraded ring oscillator.

4. The method according to claim 1 wherein said sense voltage is about equal to the supply voltage of said integrated circuit.

5. The method according to claim 1 wherein said stress voltage is between about 1.2 and 1.8 times the supply voltage of said integrated circuit.

6. The method according to claim 1 wherein the number of said plurality of capacitors and the magnitude of said sense voltage are chosen by translating the use condition Weibull distribution so that the first failure reflects a chosen percentile of the typical device lifetime.

7. The method according to claim 1 wherein said sense voltage is about one-half the supply voltage of said integrated circuit.

8. The method according to claim 1 wherein said stress voltage is between about 0.5 and 1.0 times the supply voltage of said integrated circuit.

9. The method according to claim 1 wherein the number of said plurality of metal lines and the magnitude of said sense voltage are chosen by translating the use condition lognormal distribution so that the first failure reflects a chosen percentile of the typical device lifetime.

10. A method for indicating end-of-lifetime in an integrated circuit comprising:
    predicting hot carrier injection failure by measuring the frequency of a ring oscillator being degraded by hot carrier injection and indicating failure when said frequency drops below a given threshold;
    predicting gate oxide TDDB failure by measuring the resistance of a plurality of capacitors being exercised by a stress voltage and by indicating failure when said resistance of said plurality of capacitors drops below a given threshold;
    predicting electromigration failure by measuring the resistance of a plurality of parallel connected, minimum width, metal lines being exercised by a stress voltage and by indicating failure when said resistance of said plurality of parallel connected, minimum width, metal lines rises above a given threshold; and
    indicating when either of said hot carrier injection failure, said gate oxide TDDB failure, or said electromigration failure occurs.

11. The method according to claim 10 wherein said frequency of said ring oscillator is measured by counting said pulses from said ring oscillator over a fixed interval.

12. The method according to claim 11 wherein said fixed interval is determined by a non-degrading ring oscillator.

13. The method according to claim 11 wherein said fixed interval is determined by a non-degrading ring oscillator and by dividing the frequency of said non-degraded ring oscillator.

14. The method according to claim 10 wherein said resistance of said plurality of capacitors is determined by application of a sense voltage in series with a large resistor to said plurality of capacitors and measuring the voltage across said plurality of capacitors.

15. The method according to claim 14 wherein said sense voltage is about equal to the supply voltage of said integrated circuit.

16. The method according to claim 10 wherein said stress voltage is between about 1.2 and 1.8 times the supply voltage of said integrated circuit.

17. The method according to claim 10 wherein said resistance of said plurality of parallel connected, minimum width, metal lines is determined by application of a sense voltage in series with a small resistor to said plurality of parallel connected, minimum width, metal lines and measuring the voltage across said plurality of parallel connected, minimum width, metal lines.

18. The method according to claim 17 wherein said sense voltage is about one-half the supply voltage of said integrated circuit.

19. The method according to claim 10 wherein said stress voltage is between about 0.5 and 1.0 times the supply voltage of said integrated circuit.

20. The method according to claim 10 wherein the number of said plurality of capacitors and the magnitude of said sense voltage are chosen by translating the use condition Weibull distribution so that the first failure reflects a chosen percentile of the typical device lifetime.

21. The method according to claim 10 wherein the number of said plurality of metal lines and the magnitude of said sense voltage are chosen by translating the use condition lognormal distribution so that the first failure reflects a chosen percentile of the typical device lifetime.

22. A device for indicating end-of-lifetime in an integrated circuit comprising:
    a circuit for predicting hot carrier injection failure wherein said circuit for predicting hot carrier injection failure is comprised of:
        a ring oscillator that is degrading due to hot carrier injection producing a first clock signal;
        a ring oscillator that is not degrading due to hot carrier injection producing a second clock signal;
        a $2^k$ frequency divider where k is an integer;
        a binary counter having a multi-bit output; and
        a binary comparator;
    a circuit for predicting gate oxide TDDB failure;
    a circuit for predicting electromigration failure; and
    a circuit for indicating when either of said hot carrier injection failure, said gate oxide TDDB failure, or said electromigration failure occurs.

23. The device according to claim 22 wherein said circuit for predicting gate oxide TDDB failure is comprised of:
    a capacitor bank comprised of a plurality of parallel-connected capacitors having terminals A and B;
    a first resistor electrically connected between said terminal B and a circuit common; a stress voltage source connected by a first switch to said terminal A;
    a sense voltage source connected by a second switch in series with a second resistor to said terminal A; and
    a third switch connecting said terminal A to the input of an inverter;
    wherein:
        said capacitor bank is stressed by closing said first switch and opening said second switch and said third switch; and
        said predicting of gate oxide TDDB failure is determined by opening said first switch and closing said second switch and said third switch and observing the logic state of the output of said inverter wherein if said logic level of said output of said inverter is high, said gate oxide TDDB failure has occurred.

24. The device according to claim 23 wherein the number of said plurality of capacitors and the magnitude of said sense voltage are chosen by translating the use condition Weibull distribution so that the first failure reflects a chosen percentile of the typical device lifetime.

25. The device according to claim 22 wherein said circuit for predicting electromigration failure is comprised of:
    a metal line bank comprised of a plurality of parallel connected, minimum width metal lines having terminals A and B wherein said terminal B is electrically connected to a circuit common;
    a stress voltage source connected by a first switch to said terminal A;
    a sense voltage source connected by a second switch in series with a second resistor to said terminal A; and a third switch connecting said terminal A to the input of a latch;

wherein:

said metal line bank is stressed by closing said first switch and opening said second switch and said third switch; and said predicting of electromigration failure is determined by opening said first switch and closing said second switch and said third switch and observing the logic state of the output of said latch wherein if said logic level of said output of said latch is high, said electromigration failure has occurred.

26. The device according to claim 25 wherein the number of said plurality of metal lines and the magnitude of said sense voltage are chosen by translating the use condition lognormal distribution so that the first failure reflects a chosen percentile of the typical device lifetime.

27. The device according to claim 22 wherein:

said first clock signal is applied to the input of said binary counter;

said second clock signal is applied to the input of said $2^k$ frequency divider thereby outputting a third clock signal with a frequency that is $\frac{1}{2}^k$ times the frequency of the second clock signal;

said third clock signal initializes and enables said binary counter and said binary comparator;

said multi-bit output of said binary counter is applied to said binary comparator; and said binary comparator compares said multi-bit output against a fixed binary value thereby determining if said hot carrier injection failure has occurred.

* * * * *